United States Patent
Song et al.

(10) Patent No.: US 8,461,578 B2
(45) Date of Patent: Jun. 11, 2013

(54) TOP EMISSION ORGANIC LIGHT EMITTING DEVICE

(75) Inventors: Won-Jun Song, Yongin (KR); Sun-Hee Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 180 days.

(21) Appl. No.: 13/035,753

(22) Filed: Feb. 25, 2011

(65) Prior Publication Data

US 2011/0210317 A1   Sep. 1, 2011

(30) Foreign Application Priority Data

Feb. 26, 2010  (KR) .................. 10-2010-0017917

(51) Int. Cl.
H01L 51/54 (2006.01)
(52) U.S. Cl.
USPC .......................................................... 257/40
(58) Field of Classification Search
USPC .......................................................... 257/40
See application file for complete search history.

(56) References Cited

U.S. PATENT DOCUMENTS

| | | | |
|---|---|---|---|
| 7,514,863 B2 * | 4/2009 | Lee et al. | 313/504 |
| 7,619,244 B2 * | 11/2009 | Murakami et al. | 257/40 |
| 8,174,001 B2 * | 5/2012 | Kitamura et al. | 257/40 |
| 2006/0105200 A1 * | 5/2006 | Poplavskyy et al. | 428/690 |
| 2006/0226770 A1 | 10/2006 | Lee et al. | |
| 2007/0181876 A1 * | 8/2007 | Itai | 257/40 |
| 2008/0308794 A1 | 12/2008 | Ibe et al. | |
| 2010/0207114 A1 * | 8/2010 | Koenemann et al. | 257/40 |
| 2010/0213447 A1 * | 8/2010 | Fujimoto et al. | 257/40 |
| 2010/0237341 A1 * | 9/2010 | Okumoto et al. | 257/40 |
| 2011/0037066 A1 * | 2/2011 | Uetani | 257/40 |
| 2011/0114926 A1 * | 5/2011 | Okabe et al. | 257/40 |
| 2011/0192464 A1 * | 8/2011 | Urano et al. | 136/263 |
| 2012/0119192 A1 * | 5/2012 | Kim et al. | 257/40 |

FOREIGN PATENT DOCUMENTS

| | | |
|---|---|---|
| KR | 10-2006-0108332 | 10/2006 |
| KR | 10-0685836 B1 | 2/2007 |
| KR | 2007-0071978 | 7/2007 |
| KR | 10-0751381 B1 | 8/2007 |
| KR | 10-2008-0110486 A | 12/2008 |

OTHER PUBLICATIONS

KIPO Office action dated May 18, 2011, for Korean priority Patent application 10-2010-0017917, noting Korean reference previously filed in an IDS dated Mar. 25, 2011.
Registration Determination Certificate by the Korean Intellectual Property Office for a Korean application 10-2010-0017917 dated Nov. 14, 2011.

* cited by examiner

Primary Examiner — Eugene Lee
(74) Attorney, Agent, or Firm — Christie, Parker & Hale, LLP

(57) ABSTRACT

A top emission organic light emitting device including a metal reflective layer, a first electrode, a first intermediate layer including a charge-transfer complex, a second intermediate layer including a fullerene-based material or a fluorine-containing compound, an emission layer, and a second electrode.

19 Claims, 4 Drawing Sheets

TOP EMISSION ORGANIC LIGHT EMITTING DEVICE

CROSS-REFERENCE TO RELATED APPLICATION

This application claims priority to and the benefit of Korean Patent Application No. 10-2010-0017917, filed in the Korean Intellectual Property Office on Feb. 26, 2010, the entire content of which is incorporated herein by reference.

BACKGROUND

1. Field

Aspects of the present invention relate to a top emission organic light emitting device.

2. Description of Related Art

An organic light emitting device is a self-emissive device in which light is emitted as electrons and holes are combined when a current is supplied to an organic layer inserted between an anode and a cathode. An organic light emitting device is capable of being a lightweight and thin information display device having high image quality, fast response speed, and a wide viewing angle. Organic light emitting devices have been extensively used in highly-advanced information displays as well as mobile phones.

With regard to organic light emitting devices, power consumption may be increased and lifetime may be reduced due to an increase in the progressive driving voltage of, for example, a blue device from among red, green, and blue devices. In order to address this problem, it has been suggested that a buffer layer should be formed between an anode and a cathode.

Such a top emission organic light emitting device includes a metal reflective layer formed on one surface of the anode, wherein another surface of the anode on which the metal reflective layer is not formed is oxygen plasma-treated or ultraviolet (UV)-irradiated prior to forming a buffer layer.

However, when one surface of the anode of the top emission organic light emitting device is oxygen plasma-treated, oxygen may penetrate into the metal reflective layer and thus a metal oxide may be generated in the metal reflective layer, thereby reducing lifetime and increasing a progressive driving voltage.

SUMMARY OF THE INVENTION

In embodiments of the present invention, a top emission organic light emitting device has improved driving voltage and lifetime characteristics by modifying a surface energy of an anode.

In embodiments of the present invention, a top emission organic light emitting device includes a metal reflective layer; a first electrode on the metal reflective layer; a first intermediate layer including a charge-transfer complex on the first electrode; a second intermediate layer including a fullerene-based material or a fluorine-containing compound on the first intermediate layer; an emission layer on the first intermediate layer; and a second electrode on the emission layer.

BRIEF DESCRIPTION OF THE DRAWINGS

The above and other features and aspects of the present invention will become more apparent by reference to the following detailed description when considered in conjunction with the attached drawings, in which.

DETAILED DESCRIPTION OF THE INVENTION

Figure 1:
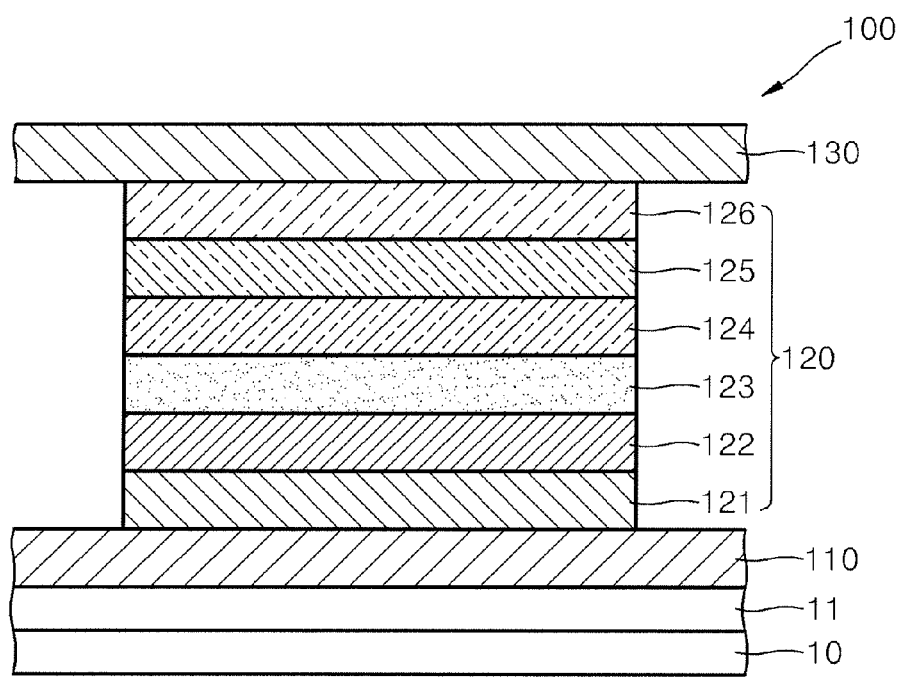
FIG. 1 is a cross-sectional view of an organic light emitting device according to an embodiment of the present invention.

Exemplary embodiments will now be described more fully with reference to the accompanying drawings. However, they may be embodied in different forms and should not be construed as being limited to the embodiments set forth herein. Rather, these embodiments are provided so that the disclosure is thorough and complete, and will fully convey the scope of the invention to those skilled in the art. In the drawings and the specification, like reference numerals refer to like elements.

According to an embodiment of the present invention, a top emission organic light emitting device includes a metal reflective layer, a first electrode, a first intermediate layer including a charge-transfer complex, a second intermediate layer including a fullerene-based material or a fluorine-containing compound, an emission layer, and a second electrode.

The top emission organic light emitting device may further include a hole transport layer formed between the second intermediate layer and the emission layer. Likewise, by forming the first intermediate layer including a charge-transfer complex and the second intermediate layer including the fullerene-based material or the fluorine-containing compound between the metal reflective layer/the first electrode and the hole transport layer, the hole transport layer may be prevented from deteriorating due to the presence of electrons, thereby improving the driving voltage, lifetime, and reliability of the top emission organic light emitting device.

The charge-transfer complex constituting the first intermediate layer may include a metal oxide and an organic compound.

Suitable metal oxides include a molybdenum oxide and a tungsten oxide. The organic compound may include at least one of N,N'-di(1-naphthyl)-N,N'-diphenylbenzidine (NPB), 4,4',4''-tris (3-methylphenylamino) triphenylamine (m-MTDATA), polyaniline/Dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), and polyaniline/poly(4-styrenesulfonate) (Pani/PSS).

In an embodiment, an amount of the organic compound is in the range of about 30 to about 70 parts by weight based on 100 parts by weight of the metal oxide. When the amount of the organic compound is within this range, the top emission organic light emitting device may have improved or excellent driving voltage and lifetime.

The fullerene-based material constituting the second intermediate layer may include at least one of C60, C70, C76, C78, C82, C90, C94, and C96.

The fluorine-containing compound of the second intermediate layer may be copper(II) 1,2,3,4,8,9,10,11,15,16,17,18, 22,23,24,25-hexadecafluorophthalocyanine (F16-CuPc).

The metal reflective layer is formed of a metal material having reflective characteristics, such as silver (Ag) or aluminium (Al).

In an embodiment, a thickness of the first intermediate layer is in the range of about 30 to about 200 Å. In some embodiments, the thickness of the first intermediate layer is in the range of about 40 to about 150 Å. A thickness of the second intermediate layer is in the range of about 30 to about 150 Å. In some embodiments, the thickness of the second intermediate layer is in the range of about 40 to about 100 Å. When the thickness of the first and second intermediate layers are within this range, charge balance may be obtained without reduction in interfacial stability.

In an embodiment, a thickness of the first electrode is about 50 to about 1000 Å, and a thickness of the metal reflective layer is about 50 to about 2000 Å.

The first electrode may be formed of at least one of indium tin oxide (ITO), indium zinc oxide (IZO), nickel (Ni), platinum (Pt), gold (Au), and iridium (Ir).

FIG. 1 is a cross-sectional view of an organic light emitting device 100 according to an embodiment of the present invention. Referring to FIG. 1, a metal reflective layer 11 formed of silver (Ag) or another suitable metal is stacked on a substrate 10, and a first electrode 110 is formed on the metal reflective layer 11. The organic light emitting device 100 includes an organic layer 120. A first intermediate layer 121 including a metal oxide as a charge-transfer complex and a second intermediate layer 122 including a fullerene-based material or a fluorine-containing compound are sequentially formed on the first electrode 110. A hole transport layer 123, an emission layer 124, an electron transport layer 125, and an electron injection layer 126 are sequentially formed on the second intermediate layer 122. A second electrode 130 is formed on the electron injection layer 126.

Hereinafter, a method of manufacturing a top emission organic light emitting device will be described. For convenience of description, a method of manufacturing the organic light emitting device of FIG. 1 will be described.

The metal reflective layer 11 is formed on the substrate 10. The substrate 10 may be a substrate generally used in an organic light emitting device, and may be a glass or transparent plastic substrate that is highly transparent, flat, waterproof, and easy to handle. In addition, a thickness of the substrate 10 may be about 0.3 to about 1.1 mm. The metal reflective layer 11 may be formed of at least one of silver (Ag) and aluminium (Al). A thickness of the metal reflective layer 11 is in the range of about 10 to about 500 Å. When the thickness of the metal reflective layer 11 is within this range, excellent processability may be obtained.

Then, the first electrode 110 is formed on the metal reflective layer 11. The first electrode 110 is formed of a conductive metal or oxide thereof, to which holes are easily injected. For example, the first electrode 110 may be formed of indium tin oxide (ITO), indium zinc oxide (IZO), nickel (Ni), platinum (Pt), gold (Au), or iridium (Ir). In an embodiment of the present invention, the first electrode 110 is formed of ITO.

The first intermediate layer 121 is formed on the first electrode 110, and is formed of a metal oxide and an organic compound, which form a charge-transfer complex. In this case, the first intermediate layer 121 is formed by vacuum-plating the metal oxide and the organic compound onto the first electrode 110.

The second intermediate layer 122 is formed on the first intermediate layer 121, and is formed of a fullerene-based material or a fluorine-containing compound. The second intermediate layer 122 may be formed using a vacuum-plating method. The material for forming the second intermediate layer 122 is not particularly limited, and examples of the materials of the second intermediate layer 122 include N,N'-bis(3-methylphenyl)-N,N'-diphenyl-[1,1-biphenyl]-4,4' diamine (TPD) and N,N'-di(naphtalene-1-il)-N,N'-diphenyl-benzidine (α-NPD).

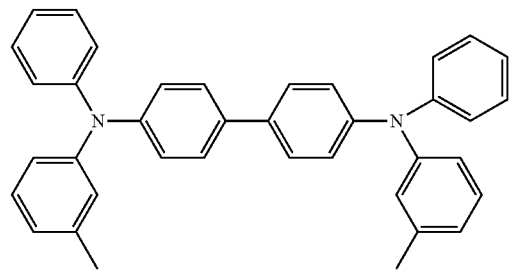

TPD

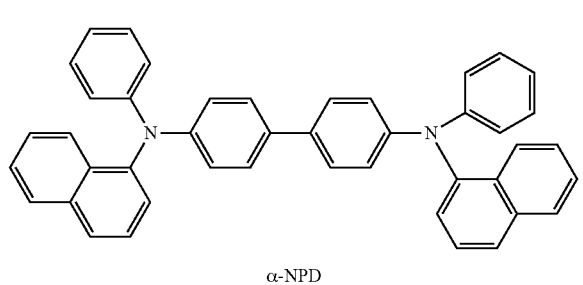

α-NPD

Then, the hole transport layer 123 is formed by vacuum thermal-depositing or spin-coating a hole transport material onto the second intermediate layer 122. A thickness of the hole transport layer is about 10 to about 3000 Å. When the thickness of the hole transport layer is within this range, an excellent driving voltage may be obtained without reduction in hole transportability.

A hole injection layer (not shown) may be further formed between the second intermediate layer 122 and the hole transport layer 123. The use of a hole injection layer and its resulting improvement in device characteristics may be determined according to the structure of a device. The material used to form the hole injection layer is not particularly limited, and examples of a hole injection material may include copper phthalocyanines (CuPc), or a starburst type amine such as TCTA or m-MTDATA.

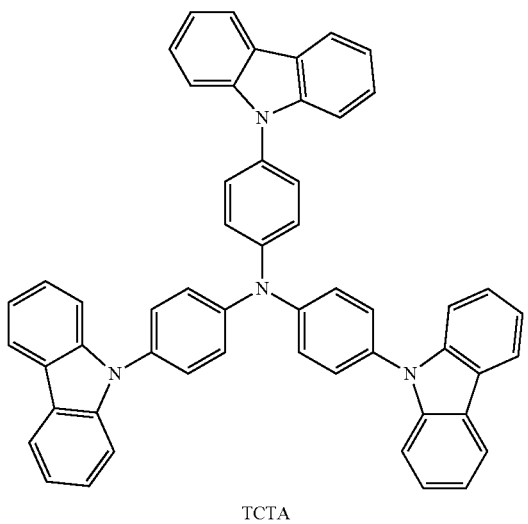

TCTA

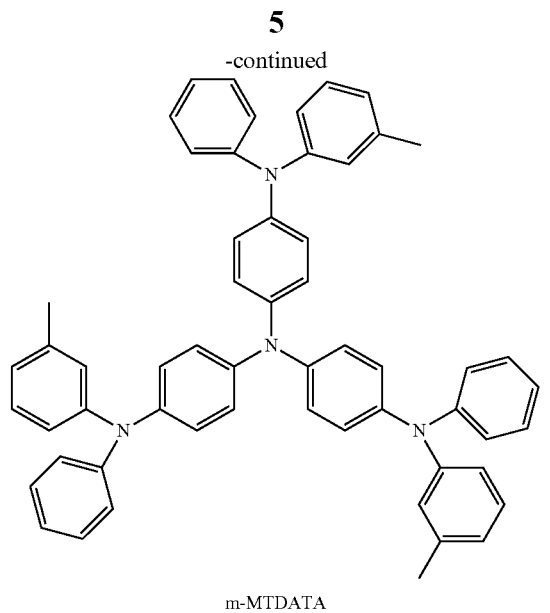

m-MTDATA

The emission layer 124 is formed on the hole transport layer 123 using vacuum thermal-depositing or spin-coating. The emission layer 124 may be formed of commonly used materials, and is not particularly limited. For example, the emission layer 124 may be formed of an aluminium complex (e.g., tris(8-quinolinolato)-aluminium (Alq3), BAIq, SAIq or Almq3), a gallium complex (e.g., Gaq'$_2$OPiv, Gaq'$_2$OAc or 2(Gaq'$_2$)), a fluorine-based polymer, polyparaphenylene vinylene, or a derivative thereof, a biphenyl derivative, or a spiro polyfluorne-based polymer.

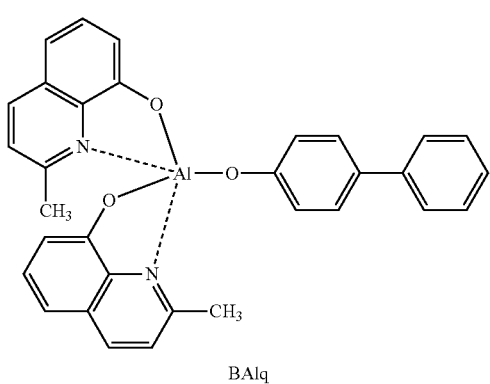

Alq3

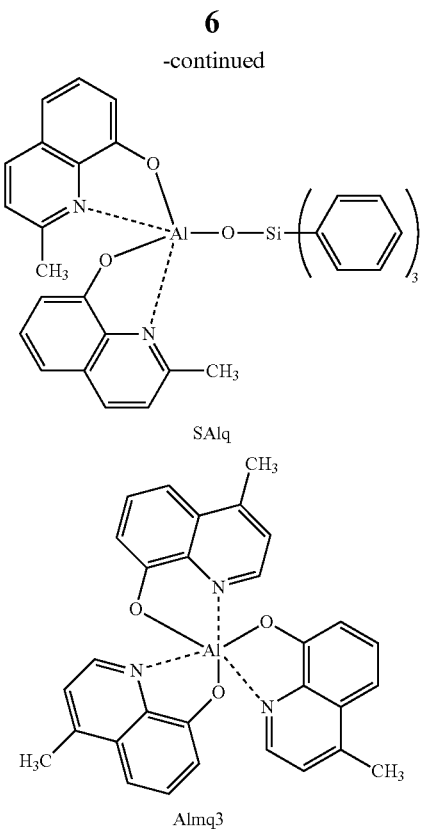

SAlq

Almq3

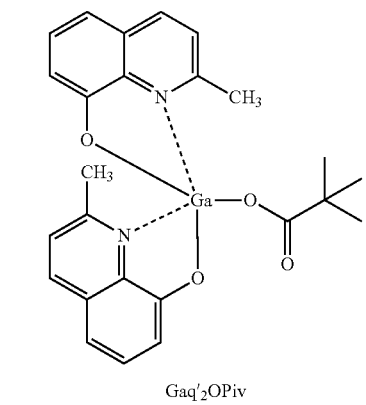

BAlq

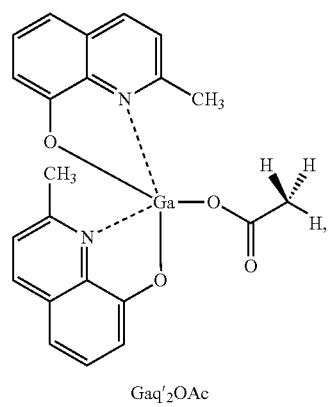

Gaq'$_2$OPiv

Gaq'$_2$OAc

-continued

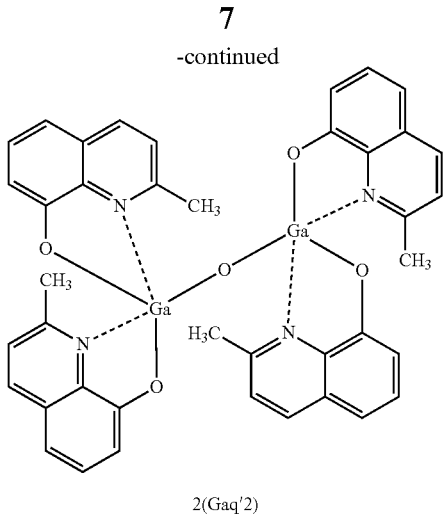

2(Gaq'2)

A thickness of the emission layer 124 is in the range of about 200 to about 300 Å. When the thickness of the emission layer 124 is within this range, excellent light emitting characteristic may be obtained without a material increase in a driving voltage.

Although not illustrated in FIG. 1, a hole blocking layer may be selectively formed on the emission layer 124 by vacuum-plating or spin-coating a hole blocking material onto the emission layer 124. The hole blocking material is not particularly limited as long as the hole blocking material can transport electrons and higher ionization potential than the compounds of the emission layer. Examples of the hole blocking materials include Balq, BCP, and TPBI. A thickness of the hole blocking layer is in the range of about 30 to about 70 Å. When the thickness of the hole blocking layer is within this range, excellent hole blocking characteristics may be obtained without a substantial increase in driving voltage.

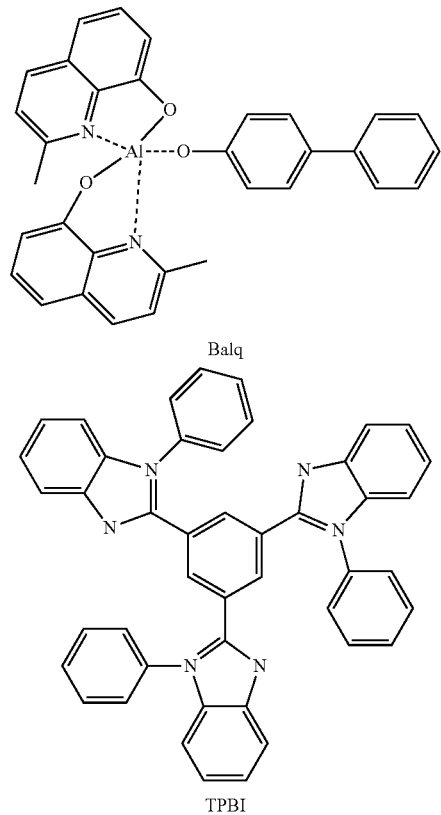

Balq

TPBI

-continued

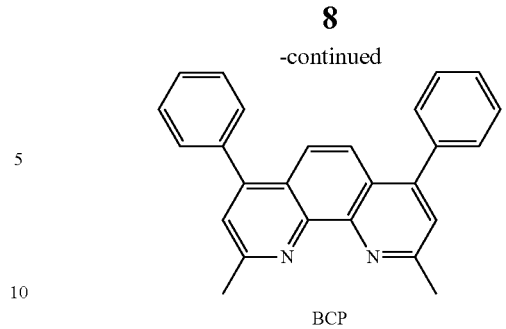

BCP

Then, the electron transport layer 125 is formed on the emission layer 124 by vacuum-plating or spin-coating an electron transport material onto the emission layer 124. The electron transport material is not particularly limited. One suitable electron transport material is Alq3.

A thickness of the electron transport layer 125 is in the range of about 150 to about 600 Å. When the thickness of the electron transport layer 125 is within this range, improved or excellent driving voltage may be obtained without a reduction in electron transportability.

The electron injection layer 126 may be stacked on the electron transport layer 125. The electron injection layer 126 may be formed of, for example, LiF, NaCl, CsF, $Li_2O$, BaO, or Liq. A thickness of the electron injection layer 126 may be in the range of about 5 to about 20 Å. When the thickness of the electron injection layer 126 is within this range, an excellent driving voltage may be obtained without a reduction in electron injection characteristics.

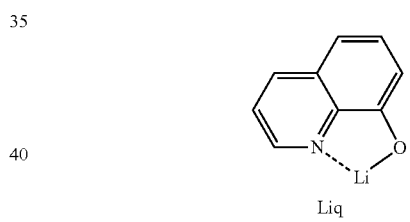

Liq

Then, a cathode, e.g., the second electrode 130, is formed by vacuum thermal-depositing a cathode metal onto the electron injection layer 126 to complete the manufacture of a top emission organic light emitting device. Examples of the cathode metal include lithium (Li), magnesium (Mg), aluminium (Al), aluminium-lithium (Al—Li), calcium (Ca), magnesium-indium (Mg—In), and magnesium-silver (Mg—Ag).

Hereinafter, one or more embodiments of the present invention will be described in detail with reference to the following examples. However, these examples are not intended to limit the purpose and scope of the one or more embodiments of the present invention.

EXAMPLE 1

A glass substrate was washed in distilled water, ultrasonically cleaned in isopropyl alcohol and pure water (each for five minutes), and then dried for one hour in a vacuum oven. A silver (Ag) layer having a thickness of 1000 Å and an ITO layer having a thickness of 100 Å were then sequentially formed on the glass substrate.

100 parts by weight of a molybdenum oxide and 50 parts by weight of NPB as a charge-transfer complex were deposited onto the ITO layer to form a first intermediate layer having a thickness of 100 Å.

C60 was deposited onto the first intermediate layer to form a second intermediate layer having a thickness of 50 Å. NPB was vacuum thermal-deposited onto the second intermediate layer to form a hole transport layer having a thickness of 650 Å.

Alq3 was deposited onto the hole transport layer to form an emission layer having a thickness of 200 Å.

Alq3 as an electron transport material was deposited onto the emission layer to form an electron transport layer having a thickness of 250 Å.

A LiF layer having a thickness of 10 Å, to form an electron injection layer, and Mg:Ag having a thickness of 500 Å, to form a cathode, were sequentially vacuum-plated onto the electron transport layer to form a LiF/Mg:Ag electrode, thereby completing the manufacture of a top emission organic light emitting device.

EXAMPLE 2

A top emission organic light emitting device was prepared in the same matter as in Example 1 except that F16-CuPc was used instead of C60 in order to form a second intermediate layer.

EXAMPLE 3

A top emission organic light emitting device was prepared in the same matter as in Example 1 except that a tungsten oxide was used instead of a molybdenum oxide in order to form the charge-transport complex of the first intermediate layer.

Comparative Example 1

A top emission organic light emitting device was prepared in the same matter as in Example 1 except that the first and second intermediate layers were not formed and a buffer layer was formed between the hole transport layer and the emission layer having a thickness of 50 Å by depositing C60 on the hole transport layer.

Figure 2:
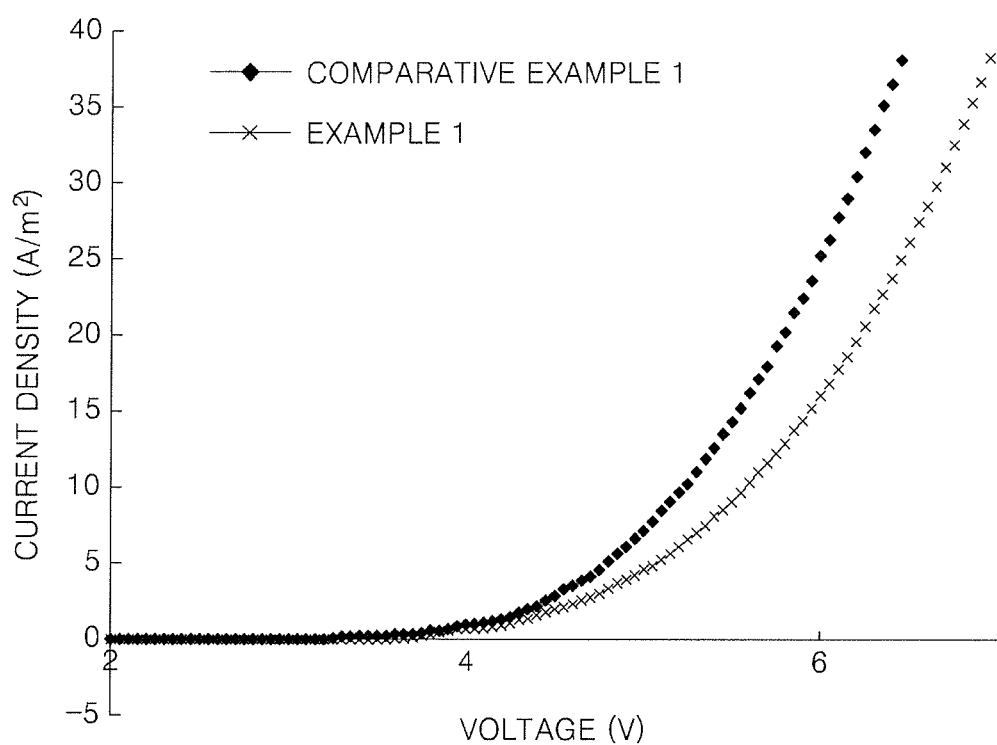
FIGS. 2 through 4 are graphs for showing driving voltages, emission efficiencies, and lifetime characteristics of organic light emitting devices prepared in Example 1 and Comparative Example 1.
Figure 3:
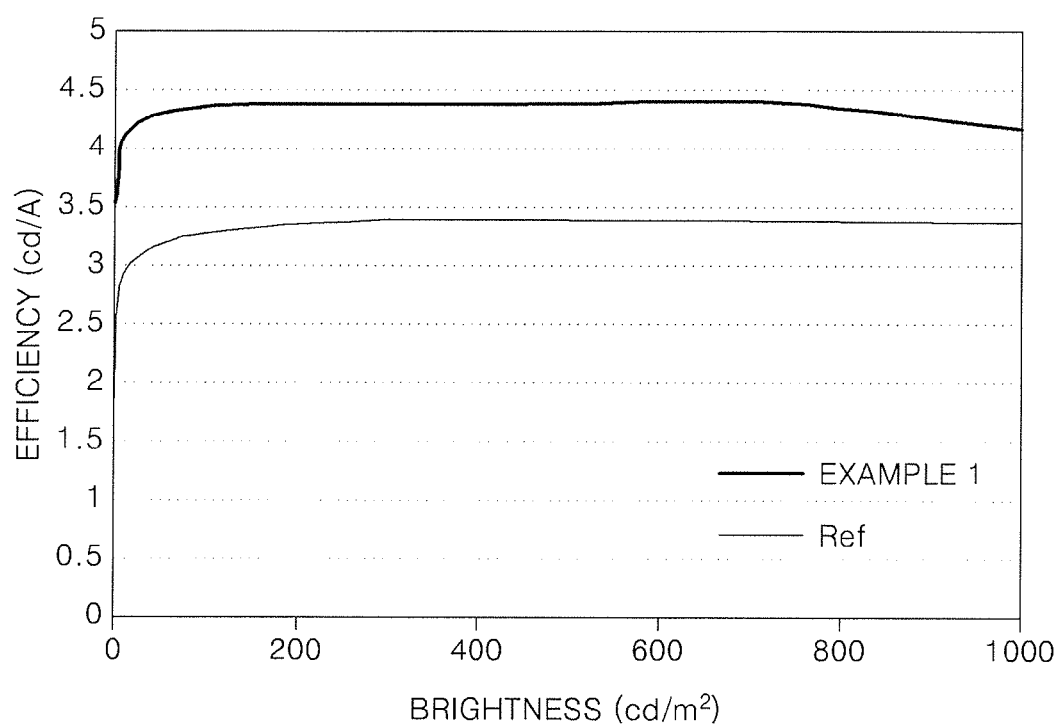
Figure 4:
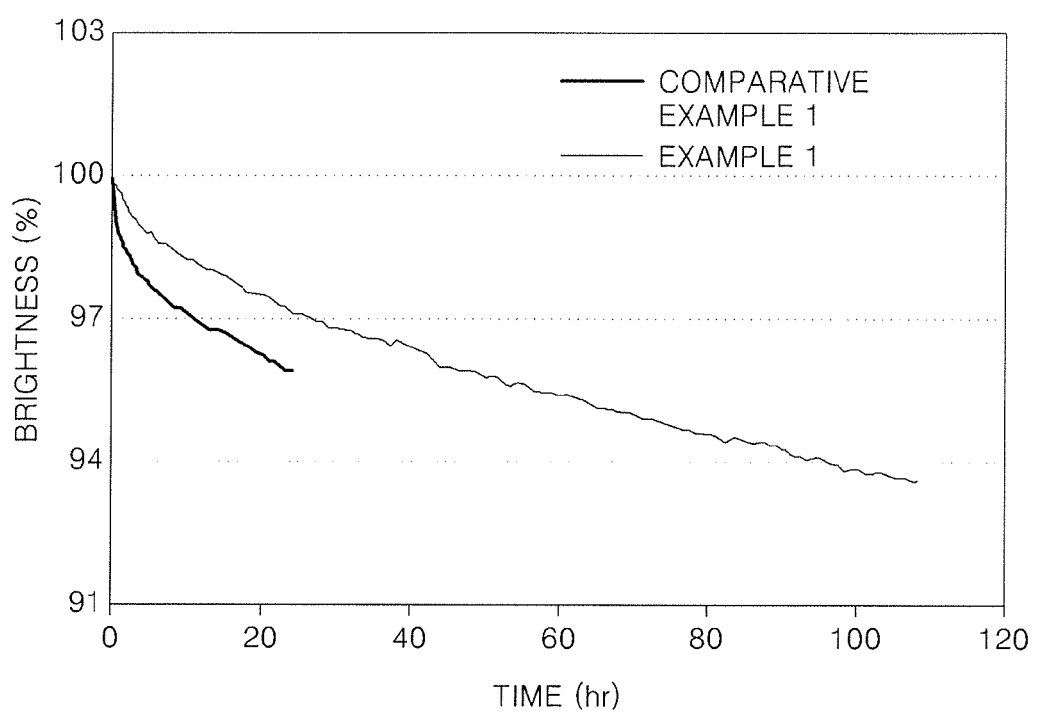

With regard to the top emission organic light emitting devices prepared in Example 1 and Comparative Example 1, driving voltages, emission efficiencies and lifetime characteristics were checked, and the results are shown in FIGS. 2 through 4.

Referring to FIGS. 2 through 4, the top emission organic light emitting devices prepared in Example 1 have improved driving voltages, emission efficiencies, and lifetime characteristics compared to those of Comparative Example 1.

In an organic light emitting device according to an embodiment of the present invention, a hole transport layer may be prevented from deteriorating due to electrons by preventing electrons from diffusing or moving, thereby improving the lifetime and driving voltage characteristics of the top emission organic light emitting device.

While the present invention has been described in connection with certain exemplary embodiments, it is understood by those of ordinary skill in the art that certain modifications may be made to the described embodiments without departing from the spirit and scope of the present invention, as defined by the appended claims and their equivalents.

What is claimed is:

1. A top emission organic light emitting device comprising:
a metal reflective layer;
a first electrode on the metal reflective layer;
a first intermediate layer comprising a charge-transfer complex on the first electrode, the charge-transfer complex comprising a metal oxide and an organic compound;
a second intermediate layer comprising a fullerene-based material or a fluorine-containing compound on the first intermediate layer;
an emission layer on the second intermediate layer; and
a second electrode on the emission layer.

2. The top emission organic light emitting device of claim 1, wherein the metal oxide comprises a compound selected from the group consisting of a molybdenum oxide, a tungsten oxide, and combinations thereof.

3. The top emission organic light emitting device of claim 1, wherein the organic compound comprises a compound selected from the group consisting of N,N'-di(1-naphthyl)-N,N'-diphenylbenzidine, 4,4',4"-tris (3-methylphenylamino) triphenylamine, polyaniline/Dodecylbenzenesulfonic acid, poly(3,4-ethylenedioxythiophene)/poly(4-styrenesulfonate), polyaniline/camphor sulfonicacid, polyaniline/poly(4-styrenesulfonate), and combinations thereof.

4. The top emission organic light emitting device of claim 1, wherein an amount of the organic compound is present at about 30 to about 70 parts by weight based on 100 parts by weight of the metal oxide.

5. The top emission organic light emitting device of claim 1, wherein the metal reflective layer comprises a metal selected from the group consisting of silver, aluminum, and combinations thereof.

6. The top emission organic light emitting device of claim 1, wherein the second intermediate later comprises a fullerene-based material selected from the group consisting of C60, C70, C76, C78, C82, C90, C94, C96, and combinations thereof.

7. The top emission organic light emitting device of claim 1, wherein the second intermediate layer comprises copper (II) 1,2,3,4,8,9,10,11,15,16,17,18,22,23,24,25-hexadecafluorophthalocyanine.

8. The top emission organic light emitting device of claim 1, further comprising a hole transport layer between the second intermediate layer and the emission layer.

9. The top emission organic light emitting device of claim 1, wherein a thickness of the first intermediate layer is in the range of about 30 to about 200 Å.

10. The top emission organic light emitting device of claim 9, wherein a thickness of the first intermediate layer is in the range of about 40 to about 150 Å.

11. The top emission organic light emitting device of claim 1, wherein a thickness of the second intermediate layer is in the range of about 30 to about 150 Å.

12. The top emission organic light emitting device of claim 11, wherein a thickness of the second intermediate layer is in the range of about 40 to about 100 Å.

13. The top emission organic light emitting device of claim 1, wherein a thickness of the metal reflective layer is in the range of about 50 to about 2000 Å.

14. A top emission organic light emitting device comprising:
a metal reflective layer;
a first electrode on the metal reflective layer;
a first intermediate layer on the first electrode comprising a charge-transfer complex comprising a metal oxide selected from the group consisting of a molybdenum oxide, a tungsten oxide, and combinations thereof and an organic compound selected from the group consisting of N,N'-di(1-naphthyl)-N,N'-diphenylbenzidine, 4,4', 4"-tris(3-methylphenylamino) triphenylamine, polyaniline/Dodecylbenzenesulfonic acid, poly(3,4-ethylenedioxythiophene)/poly(4-styrenesulfonate), polyaniline/camphor sulfonic acid, polyaniline/poly(4-styrenesulfonate), and combinations thereof;

a second intermediate layer on the first intermediate layer comprising a fullerene-based material selected from the group consisting of C60, C70, C76, C78, C82, C90, C94, C96, and combinations thereof or copper (II) 1,2,3,4,8,9,10,11,15,16,17,18,22,23,24,25-hexadecafluorophthalocyanine;

an emission layer on the second intermediate layer; and a second electrode on the emission layer.

15. The top emission organic light emitting device of claim 14, wherein the metal reflective layer has a thickness of about 50 to about 2000 Å and comprises a metal selected from the group consisting of silver, aluminum, and combinations thereof.

16. The top emission organic light emitting device of claim 14, further comprising a hole transport layer between the second intermediate layer and the emission layer.

17. The top emission organic light emitting device of claim 14, wherein a thickness of the first intermediate layer is in the range of about 30 to about 200 Å.

18. The top emission organic light emitting device of claim 14, wherein a thickness of the second intermediate layer is in the range of about 30 to about 150 Å.

19. The top emission organic light emitting device of claim 14, wherein a thickness of the first intermediate layer is in the range of about 40 to about 150 Å and a thickness of the second intermediate layer is in the range of about 40 to about 100 Å.

* * * * *

UNITED STATES PATENT AND TRADEMARK OFFICE
CERTIFICATE OF CORRECTION

| | |
|---|---|
| PATENT NO. | : 8,461,578 B2 |
| APPLICATION NO. | : 13/035753 |
| DATED | : June 11, 2013 |
| INVENTOR(S) | : Won-Jun Song et al. |

It is certified that error appears in the above-identified patent and that said Letters Patent is hereby corrected as shown below:

In the Claims

Column 10, Claim 3, line 24      Delete "sulfonicacid,"
      Insert -- sulfonic acid, --

Signed and Sealed this
Twenty-third Day of December, 2014

Michelle K. Lee
*Deputy Director of the United States Patent and Trademark Office*